(12) United States Patent
Narum et al.

(10) Patent No.: US 7,099,170 B1
(45) Date of Patent: Aug. 29, 2006

(54) REDUCED TURN-ON CURRENT CONTENT ADDRESSABLE MEMORY (CAM) DEVICE AND METHOD

(75) Inventors: Steven Narum, Nampa, ID (US); Hari Om, Santa Clara, CA (US); Nabil M. Masri, Sunnyvale, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 126 days.

(21) Appl. No.: 10/940,129

(22) Filed: Sep. 14, 2004

(51) Int. Cl.
*G11C 15/00* (2006.01)
(52) U.S. Cl. .................................... 365/49; 711/108
(58) Field of Classification Search ................ 365/49, 365/230.03, 233, 194
See application file for complete search history.

(56) References Cited

U.S. PATENT DOCUMENTS

| | | | |
|---|---|---|---|
| 5,859,791 A | 1/1999 | Schultz | |
| 6,240,000 B1 | 5/2001 | Sywyk et al. | |
| 6,253,280 B1 | 6/2001 | Voelkel | |
| 6,370,613 B1 | 4/2002 | Diede et al. | |
| 6,515,884 B1 | 2/2003 | Sywyk et al. | |
| 6,584,003 B1 | 6/2003 | Kim et al. | |
| 6,760,242 B1 | 7/2004 | Park et al. | |
| 6,763,426 B1 * | 7/2004 | James et al. | 711/108 |
| 6,804,133 B1 | 10/2004 | Khanna | |
| 6,898,661 B1 * | 5/2005 | Mori et al. | 711/5 |
| 6,958,925 B1 | 10/2005 | Om et al. | |
| 2003/0235099 A1 * | 12/2003 | Mori et al. | 365/202 |

* cited by examiner

*Primary Examiner*—Vu A. Le
(74) *Attorney, Agent, or Firm*—Bradley T. Sako

(57) ABSTRACT

A content addressable memory (CAM) device (400) can sequentially apply command and key data to different sections (404-1 to 404-4). Within each section, CAM cores (402-11 to 402-44) can be sequentially activated. Current surges when transitioning from an idle state to an active state, or vice versa, can be significantly reduced with additional latency but no loss in throughput.

20 Claims, 8 Drawing Sheets

REDUCED TURN-ON CURRENT CONTENT ADDRESSABLE MEMORY (CAM) DEVICE AND METHOD

TECHNICAL FIELD

The present invention relates generally to content addressable memory (CAM) devices, and more particularly to the execution of operations, such as search operations, within CAM devices.

BACKGROUND OF THE INVENTION

Content addressable memory (CAM) devices, sometimes also referred to as "associative memories", can provide rapid matching functions between an applied data value (e.g., a comparand, compare data, or search key) and stored data values (e.g., entries). Such rapid matching functions are often utilized in routers, network switches, and the like, to process network packets.

A typical CAM device can store a number of data values in a CAM cell array. In a compare (i.e., search) operation, entries can be compared to a compare data value (i.e., key). An entry that matches the key can result in the generation of a match indication.

In a conventional CAM device, search operations can be conducted in response to a system clock, with searches being undertaken every clock cycle. As a result, CAM devices can draw considerable current as match lines in the CAM cell array are continuously charged and discharged each clock cycle.

Current draw in CAM device can be particularly problematic in the case of a "cold start" operation. A cold start operation can occur when a CAM device switches from an idle state, in which the various CAM array sections of the device are not operational, to an active state, in which CAM array sections perform various functions, such as a search operation.

Existing conventional approaches can transition from an idle state to a full active state (e.g., search) in a single cycle. This can potentially happen on every other cycle as the CAM executes requests within a system. When CAM device portions (i.e., cores or blocks) go from an idle to an active state, there can be a very large change in the current requirement for the device. In current generation parts, such a current surge can be too large for the on-chip capacitance to support and can happen too quickly for capacitors to respond on circuit boards associated with the CAM device.

Still further, parasitic inductance of a package containing a CAM device, as well as inductance inherent in a CAM device mounting arrangement can prevent a fast ramp up of the current, preventing an adequate current supply when needed by the CAM device.

The above deficiencies can result in a power supply voltage "sag" (i.e., level dip) within the CAM device. In addition, the rapid change in current (dI/dt) through parasitic inductive elements can give rise to ground "bounce" (transient jump in a low supply voltage level), which can further disturb CAM operations. These undesirable variations in supply voltages can lead to failures. Such failures are often referred to as "cold start" failures or problems.

To better understand various feature and advantages of the disclosed embodiments of the present invention, examples of other CAM device cold start operations will now be described with reference to FIGS. 6, 7A and 7B.

FIG. 6 is a block diagram of one approach for reducing overall transient current in a CAM device. In the arrangement of FIG. 6, a CAM device 600 can be divided into two halves 602-0 and 6021, with each half performing a search on opposite edges of a clock signal. In particular, on one type of clock transitions (e.g., low-to-high), one side 602-1 (SIDE B) can precharge match lines, while other side 602-0 (SIDE A) evaluates (i.e., compares a search key to data in CAM entries). On the other clock transition (e.g., high-to-low), the two sides operate in the opposite fashion Such an arrangement can help to spread out current demand within a cycle, however, as CAM devices increase in capacity and operating speed, such an approach may not be sufficient to eliminate cold start and related problems.

A more detailed example of CAM device having alternate activation of sides according to a clock signal is shown in FIG. 7A, and designated by the general reference character 700. CAM device 700 can include a number of CAM blocks 702-1 to 702-8. The CAM blocks are arranged into one side 704-0, that includes CAM blocks (702-1 to 702-4), and into another side 704-1, that includes CAM blocks (702-5 to 702-8).

The CAM blocks of side 704-0 receive command and search key data from an input bus 706, and are commonly activated according to a first clock signal CLK. In the case of a search command, search results are latched on CLKB and output to an output latch 708.

The CAM blocks of side 704-1 can also receive command and search key data from an input bus 706. However, the CAM blocks of this side are commonly activated according to a second clock signal CLKB, which can be the inverse of the first clock signal. Results from this side 704-1 can be output to priority logic 710. In addition, same search results from the other side 704-0 can be output from output latch 708 to priority logic 710.

The operation of the arrangement of FIG. 7A is shown in FIG. 7B. FIG. 7B is a timing diagram that includes waveforms for the first and second clock signals CLK and CLKB. In addition, the state of each CAM block is shown (CAM1 to CAM8), along with a device current supply ISUPP, and change in device current ΔI.

FIG. 7B shows a CAM device going from an idle state to an active state at time t0. That is, the CAM device undergoes a "cold start" at time t0.

As shown by the ISUPP and ΔI waveforms, on a first type transition of the clock signal (CLK low-to-high), a current surge can occur as the CAM blocks of one side of the CAM device are activated. Similarly, in the next clock transition at time t1 (CLK high- to-low), a second current surge can occur. A theoretical current rate limit is shown as "ΔIcollapse". This limit represents a current surge value at which errors can occur and/or device reliability can be compromised.

The above noted current surges can cause supply dips, which in turn, can cause device failures.

One very a particular type of device failure is shown in FIGS. 8A and 8B. FIG. 8A is a block schematic diagram of a CAM entry and corresponding match detect circuitry. It is understood that such a structure is repeated numerous times within each CAM block.

FIG. 8A shows a CAM entry 800 that can include a number CAM cells commonly connected to a match line ML. A CAM entry 800 can compare a stored data value with compare data (key) CD. A match line ML can provide one input to a match sense amplifier MSA. An MSA can determine a match/no-match according to a comparison between an input voltage SAIN (which corresponds to a match line voltage) and a threshold voltage Vthresh for the MSA.

FIG. 8B shows one example of how a cold-start error can occur. FIG. 8B is a timing diagram showing a clock signal CLK, power supply levels VDD and VSS, and various sense waveforms.

The sense waveforms show a match line voltage ML, a sense input potential SAIN, as well as two sense voltage waveforms, one corresponding to an ideal case VSENSE (IDEAL), such as that when a CAM device has executed a series of sequential search operations and thus has fully "ramped-up" power supply levels. The other waveform VSENSE(COLD) corresponds to a cold start case, such as when a CAM device transitions from idle to a search operation.

Referring still to FIG. 8B, on the rising edge of clock signal CLK, one half (SIDEA) of a CAM device can precharge a match line in preparation for the search and the other half (SIDEB) of the device can execute the search. In particular, on a falling edge of the clock signal CLK, a SIDEB half precharges a match line in preparation for the next search while the SIDEA half executes the search. As shown in the figure, a current surge on each edge of clock CLK can cause a low supply VSS (e.g., ground) to rise and high supply VDD to sag. This can effectively lower a level of the 'match' trip point (Vthresh). This is represented by the difference in the VSENSE(IDEAL) and VSENSE(COLD) levels.

A typical CAM arrangement will have some predetermined setup time, for the latch to correctly latch the data after which match data can no longer be compared. That is, a match result value would need to be sensed and latched prior to the setup time period. FIG. 8B shows two time periods, a setup time for the ideal case Tsetup(IDEAL), which begins at time t2, and another for a cold start case Tsetup(COLD), which begins at time t3.

A comparison between the ideal and cold-start cases demonstrates how cold-start errors can occur. In the ideal case, prior to time t2, a sense node potential SAIN falls below a sense voltage VSENSE(IDEAL). This can indicate a MISS result. In contrast, in the cold start case, a sense voltage VSENSE(COLD) can remain above the level needed to indicate a miss for a longer duration. The result can be a setup time, Tsetup(COLD), that can be "pushed" out beyond the necessary setup time Tsetup for a latch. Consequently, search result logic can indicate a hit when the search actually results in a miss.

It is believed that the above-described errors are most likely to occur in the case of a single bit miss, where a single exclusive-OR (XOR) stack within one CAM cell of an entry has to discharge an entire match line. If more than one bit misses, then two or more XOR stacks can pull the match line low, and the match line can discharge much more quickly, and so is more likely to fall below a sense voltage potential prior to a setup time Tsetup.

Increases in supply current surges, like those noted above, can result in other drawbacks. When the current demand stops at the end of a long sequence of searches, the inductance of the packaging can keep current flowing, resulting in a boost in supply voltage levels. Such rises in the supply voltages can stress the gate oxide of metal-oxide-semiconductor (MOS) type transistors, increasing the possibility of oxide breakdown in such devices. In addition, such increases in supply level can lead to electromigration in conductive lines, which can lead to higher resistance signal lines, or in a worst case, opens.

Examples of approaches to clocking different portions of CAM device are disclosed in U.S. Pat. No. 6,240,000, titled CONTENT ADDRESSABLE MEMORY WITH REDUCED TRANSIENT CURRENT, issued to Sywyk et al. on May 29, 2001. Another arrangement is disclosed in commonly-owned co-pending U.S. patent application Ser. No. 10/746,899, titled STAGGERED COMPARE ARCHITECTURE FOR CONTENT ADDRESSABLE MEMORY by Om et al., filed on Dec. 24, 2003. The contents of this application are incorporated by reference herein.

In light of the above, it would be desirable to arrive at some way of reducing the peak current drawn by a CAM device when transitioning from a low activity state (e.g., idle) to a high activity state (e.g., search).

It would be desirable if such an arrangement does not decrease overall throughput of the CAM device.

SUMMARY OF THE INVENTION

The present invention can include a content addressable memory (CAM) device. The CAM device can be divided into a plurality of sections. Each section can include a plurality of blocks, with each block having a number of CAM entries. The CAM blocks can be placed into an active mode or an idle mode, the active mode consuming more current than the idle mode. The CAM device can also include a command data input circuit and a block activation circuit. A command data input circuit can sequentially apply command data to the sections. A block activation circuit can activate the blocks in each section in a sequential fashion.

In such an arrangement, current drawn in a start-up operation can be gradually increased by sequential activation of different sections, as well sequential activation of blocks within each section. As a result, undesirably large current surges can be reduced or eliminated.

According to one aspect of the embodiments, each block enters the active mode in response to at least a search command.

Such a feature provides peak current savings for CAM operations that typically draw the most current (searches).

According to another aspect of the embodiments, a command data input circuit can apply command and search data to the sections according to a periodic signal. In one very particular arrangement, a periodic signal can have a period T.

When operating according to a period T, according to one feature of the invention, a block activation circuit can sequentially activates all blocks in a given section within the period T. In a more particular case, a block activation circuit can activates all blocks in a given section within the period ½ T.

Such an arrangement can ensure that when switching from an idle mode to an active mode, current surges are limited to the blocks of one section at any given time.

According to another aspect of the embodiments, the sections of the CAM device include a first section and one or more subsequent sections. In addition, a command data input circuit can include input registers connected to an input of each subsequent section. Such input registers can be commonly controlled by the same timing signal.

In this way, command data (e.g., search commands and keys) can propagate from one section to the next according to a single clock signal. Such an arrangement can ensure that processing throughput is maintained, while introducing some latency into the results.

According to another aspect of the embodiments, each section can include a first block and one or more subsequent blocks. A block activation circuit can include a delay circuit coupled to each subsequent block arranged in series, with a first delay circuit receiving a timing signal.

Such an arrangement can provide a compact way of generating sequential activation signals for blocks within each section.

According to another aspect of the embodiments, a command data input circuit can sequentially apply command and search data to sections according to a periodic clock signal. In addition, a block activation circuit can receive the same periodic signal as an input for sequentially activating blocks within each section.

In this way, timing for the application of command data and the activation of blocks can be based in a single device (or system) clock.

According to another aspect of the embodiments, a periodic clock signal received by both a command data input circuit and block activation circuit can have a period T. In addition, each delay circuit in the block activation circuit can delay such a clock signal by no more than ⅛ T.

Such an arrangement spaces the activation of blocks in time to help ensure that power supplies and or inherent parasitic elements have sufficient time to recover from resulting current surges.

According to another aspect of the embodiments, each section of a CAM device can provide section results on a corresponding output bus. In addition, a CAM device can also include a result logic circuit that can generate an overall device result from the section results. Further, an output synchronization circuit coupled to each output bus can provide the section results from each section to the result logic circuit.

In this way, sequentially generated search results from each section can be commonly collected and applied to a result logic circuit to provide a single overall search result.

According to one aspect of the embodiments, sections of a CAM device have an order corresponding to the order in which command data is received. In addition, an output synchronization circuit can include a clocked output path corresponding to at least a first section and a subsequent section. A clocked output path corresponding to the first section can have a number of result registers arranged in series between the output bus of the first section and the result logic circuit. Similarly, the clocked output paths for subsequent sections can have result registers. However, each such output path will have a smaller number of registers according to its position in the order of the sections.

Such an arrangement can enable sequentially generated search results from multiple sections to be synchronized for common application to a result logic circuit according to one common clock signal.

The present invention can also include a CAM device having a plurality of blocks logically arranged into matrix of rows and columns, each block including a plurality of CAM entries that each search operation compares a stored data value with an applied search key. The CAM device also includes a first control circuit (e.g., command data input circuit) that sequentially activates columns of blocks in response to the same search command, as well as a second control circuit (e.g., a block activation circuit) that sequentially activates rows of blocks in response to the same search command.

According to one aspect of the embodiments, the matrix of blocks can include a first column having a column input coupled to a command data bus and a number of subsequent columns. A first control circuit can include a plurality of command data registers coupled in series with one another. A first command data register can have an input coupled to a first input data bus. Command data registers can each have an output coupled to one of the subsequent columns of blocks.

Still further, a second control circuit can include a plurality of delay circuits coupled in series with one another. A first delay circuit can have an input coupled to a clock signal. Each delay circuit can have an output coupled to one of the rows of blocks.

The present invention can also include a method of activating a content addressable memory (CAM) device in response to a command. The method can include receiving a predetermined CAM operation command, sequentially applying command data to multiple sections of the CAM device, and sequentially activating multiple blocks within each section.

According to one aspect of the embodiments, a predetermined CAM operation command can include a search command and search key data.

According to another aspect of the embodiments, the step of sequentially applying command data to multiple sections can include applying command data to a first section, and applying command data to a subsequent section after all of the multiple blocks of a previous section have been sequentially activated to process the same command data.

According to another aspect of the embodiments, the step of sequentially applying command data to multiple sections of the CAM device includes applying command data on subsequent edges of a periodic clock signal.

According to another aspect of the embodiments, the step of sequentially activating multiple blocks within each section can include generating a plurality of block activation signals by delaying a periodic clock signal by increasingly larger amounts, and activating each of the blocks according to a different block activation signal.

According to another aspect of the embodiments, a number of blocks in each section can be N and a periodic signal can have a period T. Further, block activation signals are delayed by an amount no greater than T/N. In one particular example, block activation signals are delayed by an amount no greater than T/(2N).

DETAILED DESCRIPTION

Various embodiments of the present invention will now be described in detail with reference to a number of drawings.

The embodiments include a content addressable memory (CAM) device and operating method that can alleviate "cold start" current surges by limiting current drawn on start-up, and thereby giving a supply current time to build up to a full running level.

A CAM device and method of the present invention can spread an operation (e.g., search) over multiple operating cycles. As a result, current drawn by a search operation can ramp up and down more slowly than conventional cases.

Figure 1:
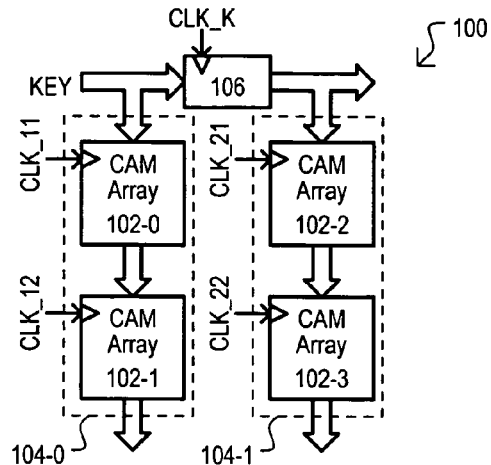
FIG. 1 is a block schematic diagram of a first embodiment of the present invention.

A CAM device according to a first embodiment is shown in FIG. 1, and designated by the general reference character 100. A CAM device 100 can include a number of CAM arrays 102-0 to 102-3. It is understood that each CAM array (102-0 to 102-3) can include a number of CAM entries, each of which can compare a key value KEY to a stored data value and generate a match result as a response.

The CAM arrays (102-0 to 102-3) can be conceptualized as being arranged into a 2×2 matrix, with two rows and two columns. Columns can be conceptualized as being sections 104-0 and 104-1. In a search operation, each section (104-0 and 104-1) can receive a search key value KEY in a sequential fashion. That is, a search KEY can be applied to first section 104-0, and a predetermined time later, can be applied to a next section 104-1.

In the very particular example of FIG. 1, sequential application of a search key value is accomplished by a register 106 controlled by a clock signal CLK_K.

In this way, a CAM device can include sequential activation of columns of CAM arrays. This can reduce the peak current consumption needed in a search operation.

Additional reductions in current surges can be accomplished by sequential activation of the CAM arrays within a same section. Thus, in the example of FIG. 1, within section 104-0, CAM arrays 102-0 and 102-1 are not activated simultaneously, but rather one after the other. Thus, clock signal CLK_12 is activated after clock signal CLK_11. In the same general fashion, within section 104-1, CAM arrays 102-2 and 102-3 can be activated one after the other following receipt of a search key, with clock signal CLK_22 being activated after clock signal CLK_21.

Preferably, all CAM arrays within one section can be activated before any CAM arrays in a next section. This is illustrated in FIGS. 2A to 2D.

FIGS. 2A to 2D show one example of a cold start operation for a CAM device like that of FIG. 1. FIGS. 2A to 2D show the state of the same CAM blocks (102-0 to 102-3) as the cold start progresses.

Figure 2A:
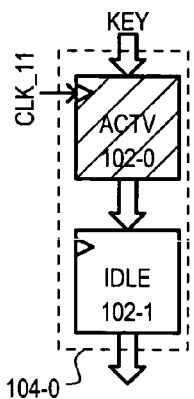
FIGS. 2A to 2D are block schematic diagrams showing the operation of the embodiment set forth in FIG. 1.

As shown in FIG. 2A, initially a search command can be issued, resulting in the search key KEY being applied to a first section 104-0. A first CAM array 102-0 can be activated according to clock signal CLK_11. As but one example, such an operation can include precharging match lines for CAM entries in the CAM array 102-0 and/or applying a search key value to generated match results from such match lines.

Figure 2B:
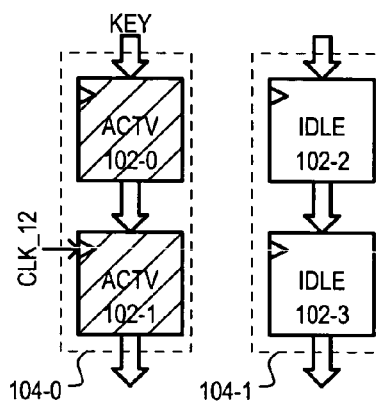
Figure 2C:
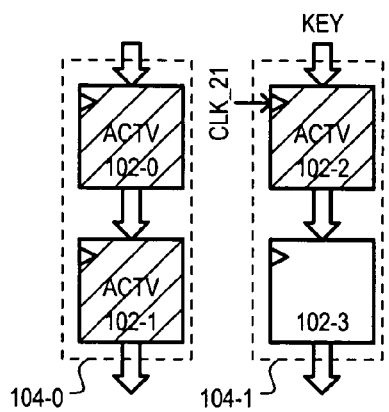
Figure 2D:
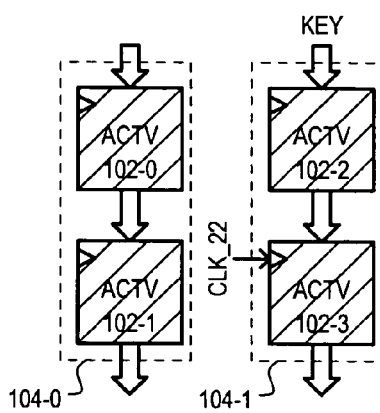

As shown in FIG. 2B, following the activation of CAM array 102-0, a next CAM array in the same section can be activated. Thus, in the example shown, CAM array 102-1 can be activated according to clock signal CLK_12.

Once all CAM arrays within a first section 104-0 have been activated, sequential activation of CAM arrays 102-2 and 102-3 can continue in the next section 104-1.

In this way, a CAM device can include sequential activation of columns of CAM arrays, with sequential activation on a row-wise basis within such a column.

While the embodiments have shown sequential activation of two sections 104-0 and 104-1, it is understood that the present invention should not be limited to such a number. As would be understood by those skilled in the art, the greater the number of sections in a same sized CAM device, the smaller the resulting current surges.

Further, while the above approach can introduce additional latency into a search result, the overall throughput of back-to-back searches can remain unchanged from the above noted conventional approaches, as searches can still be launched on every clock cycle. That is, internally, each search can be pipelined through sequential CAM sections, with one section executing a particular search at any given time. This is demonstrated in FIG. 3.

Figure 3:
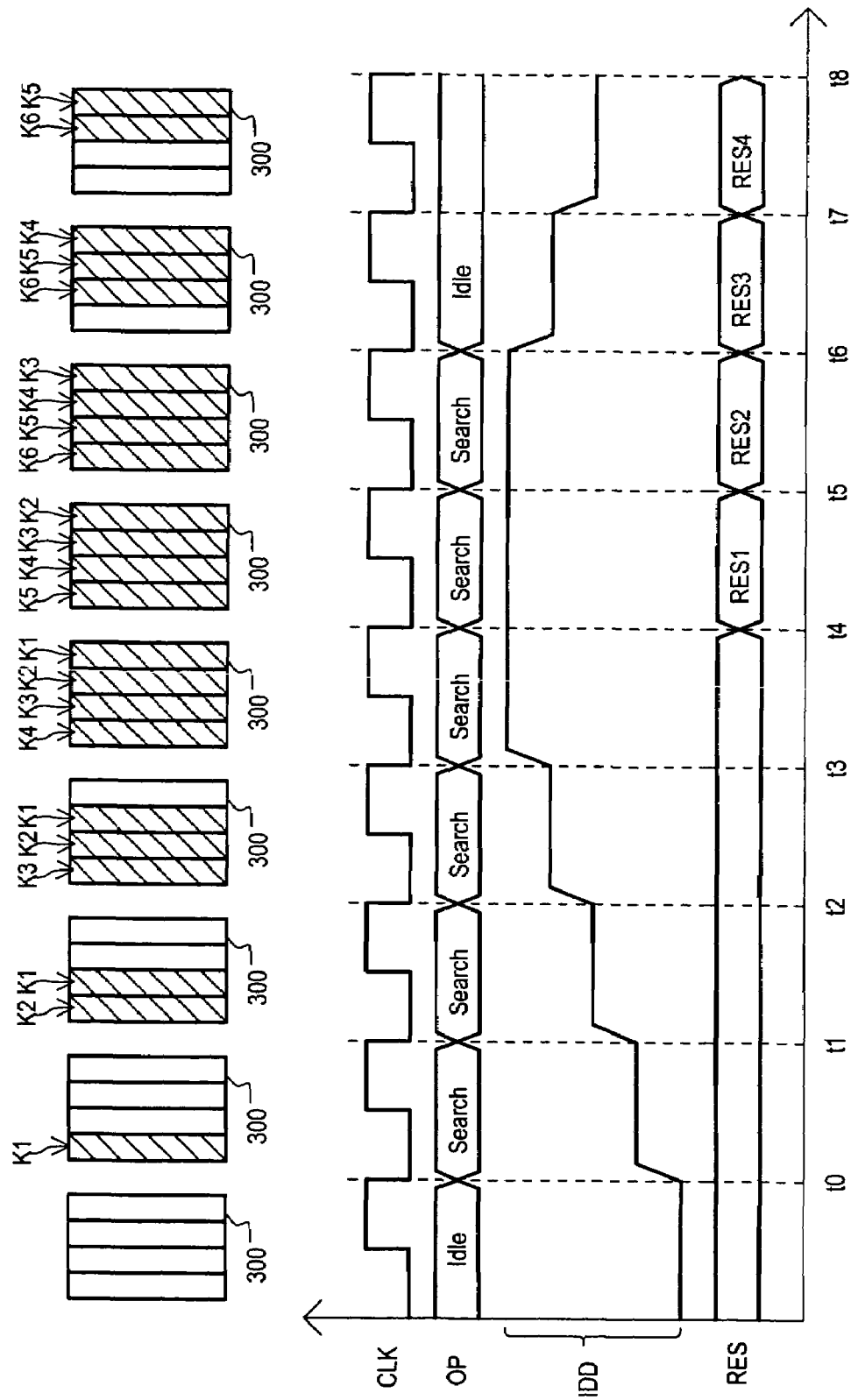
FIG. 3 is a timing diagram and diagram of a CAM device according to a second embodiment of the present invention.

FIG. 3 shows back-to-back (pipelined) searches with six search keys K1 to K6. Included in FIG. 3 is a timing diagram as well as a sequential representation of a CAM device 300 that includes four sections. Each view of the CAM device 300 corresponds to the clock cycle directly below in the timing diagram. A section of CAM device 300 can be considered active if it includes hatching, otherwise a section can be considered idle. Further, a key notation K1 to K6 illustrates which key is being searched by a particular section during the cycle.

The timing diagram of FIG. 3 includes waveforms for a clock signal CLK, an operation description OP, a supply current IDD, and a search result RES.

Prior to time t0, a CAM device 300 may be in an idle state. Thus, none of the four sections include hatching or a key notation. In addition, a supply current IDD can remain at some relatively low idle value.

At time t0, a CAM device 300 can begin a cold start with a search operation based on a key K1. Between times t0 and t1, key K1 can be searched in a first section of CAM device 300, while the other sections of CAM device 300 remain idle. As a result, there is only a relatively small increase in supply current IDD.

At time t1, a search operation can begin with a next key K2. Thus, between times t1 and t2, key K2 can be searched in a first section of CAM device 300, while key K1 is searched in next section. Because this cycle (t1 to t2) only activates one additional section over the previous cycle (t0 to t1), there is essentially the same, relatively small increase in supply current IDD.

Back-to-back searches can continue with a search operation for key K3 starting at time t2, and a search operation for key K4 starting at time t3. Such searches are accompanied by corresponding relatively small increases in supply current IDD. Between times t3 and t4 all sections are active, thus a CAM device can be considered to be fully "ramped up".

In this way, a supply current can be gradually increased in a slow start case, thus limiting current surges to relatively small sizes that are more easily accommodated by device supply capacitance and/or external capacitors for a CAM device. As a result, cold start errors due to such surges can be reduced and/or eliminated.

In the very particular example of FIG. 3, a CAM device can have a four-cycle latency. Thus, at time t4, a search result for key K1, shown as RES1 can be generated. As shown in the figure, search results can continue to be output every cycle. Thus, while the embodiment introduces latency into search results, overall throughput is not impacted.

Referring still to FIG. 3, at time t6, the back-to-back searches can cease. As a result, a first section can return to the idle state. This results in a relatively small drop in supply current. This continues at time t7, with a next section going idle. It is understood that if the next two cycles are idle operations, a CAM device can return to an overall idle state (e.g., all sections idle).

In this way, a supply current can be gradually decreased when a CAM device returns to an overall idle state. As a result, the inherent inductance of the CAM device and/or its mounting, will generate little, if any, undesirable boost in the power supply level. This can result in increased reliability of the CAM device, as gate oxides are not stressed and/or electromigration in signal lines is reduced.

Figure 4:
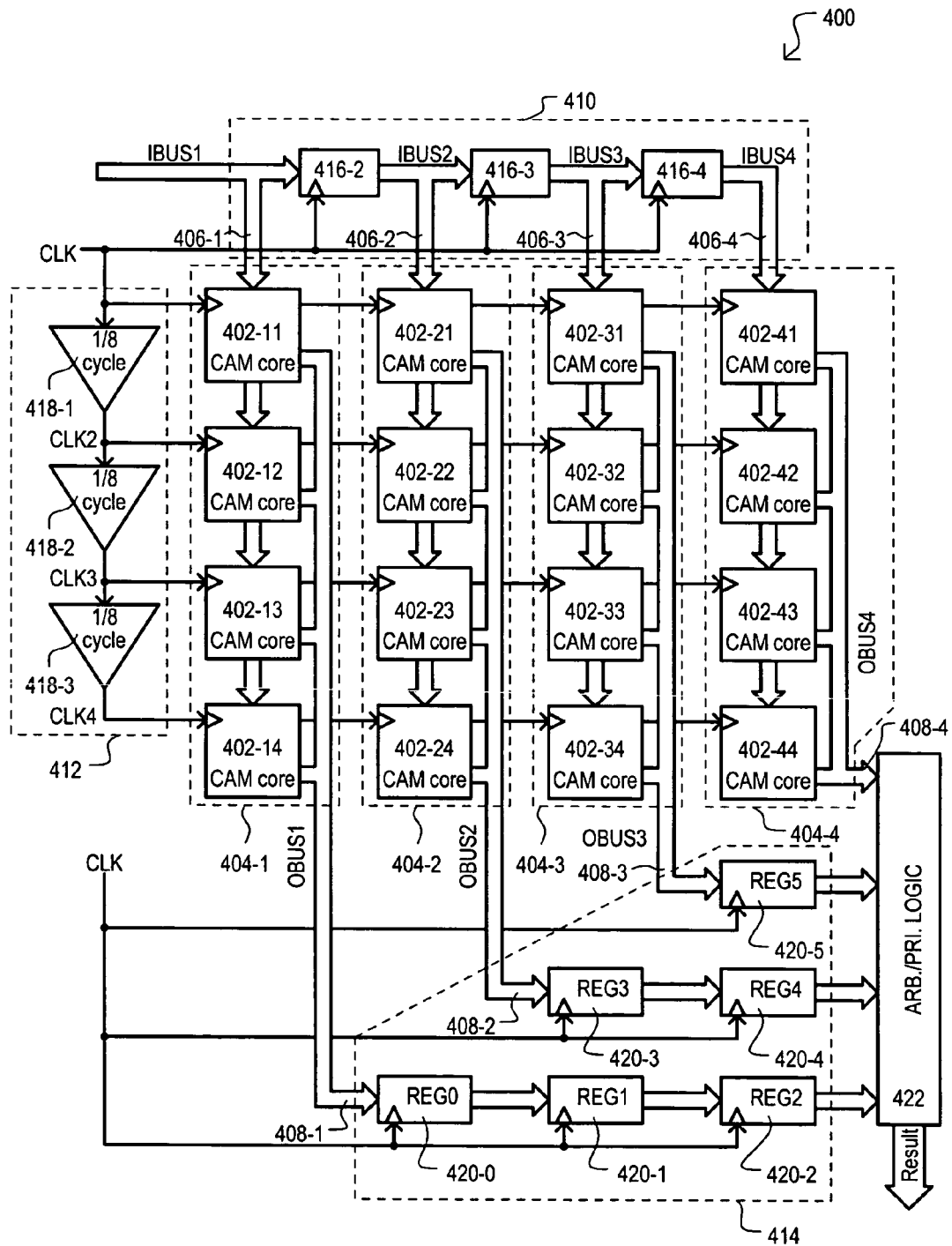
FIG. 4 is a block schematic diagram of a CAM device according to a third embodiment of the present invention.

A CAM device according to a third embodiment is shown in a detailed block schematic diagram in FIG. 4, and designated by the general reference character 400. A CAM device 400 can include a number of CAM "cores" 402-11 to 402-44. Each CAM core (402-11 to 402-44) can include a number of CAM entries that a search operation can compare stored data with an applied search key and provide search results. Thus, in some embodiments a CAM core can include prioritizing and encoding circuits.

CAM cores (402-11 to 402-44) can be organized into a number of sections 404-1 to 404-4. Each section (404-1 to 404-4) can receive a command and key data by way of a corresponding input bus 406-1 to 406-4. Command and key data received by a section (404-1 to 404-4) can be applied in parallel or sequentially to the corresponding CAM cores of the section. In response to command and key data, each section (404-1 to 404-4) can provide result data on a corresponding output bus 408-1 to 408-4. More particularly, a CAM core (402-11 to 402-44) can begin in an idle state, and be activated upon receiving valid command data and receiving an active control clock (described in more detail below).

The particular CAM device 400 of FIG. 4 can also include a first control (command data input) circuit 410, second control (block activation) circuit 412, and a result output circuit 414. A first control circuit 410 can sequentially apply command and key data to sections (404-1 to 404-4) on input buses (406-1 to 406-4). In the very particular example of FIG. 4, a first control circuit 410 can include a number of input registers 416-2 to 416-4, arranged in series with one another. Input registers (416-2 to 416-4) can be commonly clocked by a clock signal CLK. In this way, received command and key data can be applied to first section 404-1 by way of input bus 406-1, and then propagated by input latches (416-2 to 416-4) to subsequent sections (404-2 to 404-4) on each following clock cycle.

A second control section 412 can sequentially activate CAM cores within a same section. In the very particular example of FIG. 4, a second control circuit 412 can include a number of delay buffers 418-1 to 418-3 connected in series that receive clock signal CLK as an input. Each delay buffer (418-1 to 418-4) can output a corresponding activation clock CLK2 to CLK4. In the example shown, each delay buffer (418-1 to 418-4) can provide a delay equal to one ⅛ the period of the clock signal CLK. Clock CLK and activation clocks CLK2 to CLK4 can each activate a corresponding row of CAM cores. Thus, clock CLK can activate CAM cores 402-11, -21, -31 and -41, activation clock CLK2 can activate CAM cores 402-12, -22, -32 and -42, etc.

A result output circuit 414 can include a number of output registers (420-0 to 420-5) for synchronizing result data from each section (404-1 to 404-3) for common application to arbitration/priority (A/P) logic 422. In the very particular example of FIG. 4, a result output circuit 414 can include a first series of output registers 420-0, -1, -2 arranged in series between output bus 408-1 and A/P logic 422. In a similar fashion, a second series of output registers 420-3 and -4 (having one less register than the first) can be arranged in series between output bus 408-2 and A/P logic 422. A single output register 420-5 can be arranged between output bus 408-3 and A/P logic 422. Output bus 408-4 can provide result data directly to A/P logic 422.

In FIG. 4, all output registers 420-0 to 420-5 can be commonly clocked by clock signal CLK. In such an arrangement, result data for one search, sequentially spread over multiple sections, can be captured by registers, and then commonly applied to A/P logic 422.

Figure 5A:
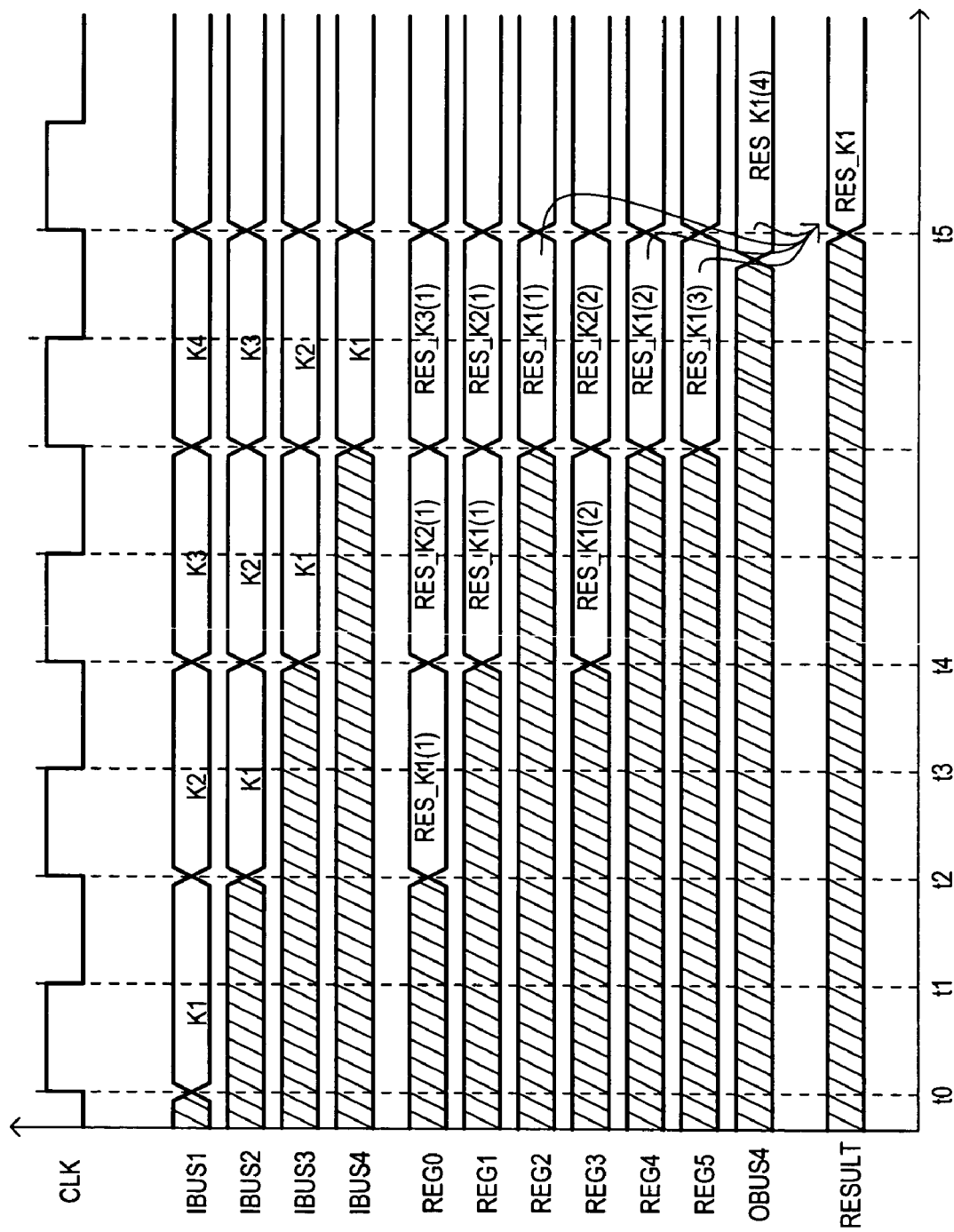
FIGS. 5A and 5B are timing diagram showing the operation of the CAM device of FIG. 4.

Having described various components of a CAM device according to a third embodiment 400, the operation of such a CAM device will now be described with reference to FIG. 5A. FIG. 5A is a timing diagram having a number of waveforms including clock signal CLK, input buses IBUS1 to IBUS4 (406-1 to 406-4), output registers REG0 to REG5 (420-0 to 420-5), result output bus OBUS4 (408-4), and a finalized result RESULT provided by A/B logic 422.

Referring now to FIG. 4 in conjunction with FIG. 5A. At time t0, a command (assumed to be a search in this example) and search key K1 can be received on input bus IBUS1 and applied to CAM cores within section 404-1. At this time clock signal CLK is active, thus CAM core 402-11 can be activated. CAM cores within sections 404-2, -3 and -4 can also receive such an active signal. However, because such CAM sections have not yet received valid command data, CAM cores within such sections can remain inactive (i.e., idle). According to the sequential activation of activation clocks CLK2 to CLK4, remaining CAM cores of the section (in this case 402-12, -13, -14) can be activated to search according to key K1. As a result, a search result (RES_K1 (1)) for section 404-1 can be output on output bus 408-1.

At time t2, according to clock signal CLK, the search result on output bus 408-1 can be latched and output from register REG0 (420-0).

Also at time t2, command and search key K1 can be latched and output from input register 416-2 on input bus IBUS2, and applied to CAM cores within next section 404-2. At the same time, a new search command and search key K2 can be received on input bus IBUS1 and applied to CAM cores within section 404-1. At this time clock signal CLK is once again active, thus CAM core 402-11 can be activated to process key K2. At the same time CAM core 402-21 can also be activated to process key K1 having now received valid command data. However, remaining CAM cores in sections 404-3 and -4 can remain idle, having not yet received valid command data. According to the sequential activation of activation clocks CLK2 to CLK4, remaining CAM cores of section 404-1 can be activated to search according to newly arrived key K2. At the same time, and in parallel, remaining CAM cores of section 404-2 can be activated to search according to previously received key K1. As a result, a search result RES_K2(1) for section 404-1 can be output on output bus 408-1, and a search result RES_K1 (2) for section 404-2 can be output on the output bus 408-2.

At time t4, according to clock signal CLK, search result RES_K2(1) on output bus 408-1 can be latched and output from register REG0 (420-0), and search result RES_K1(2) on output bus 408-2 can be latched and output from register REG3 (420-3). Still further, search result RES_K1(1) can propagate to register REG1 (420-1).

The CAM 400 continues to operate in the manner described above, generating search results, capturing search results form different columns in output registers, then forwarding such results to A/P logic 422.

At time t5, all search results for key K1 have been generated. More particularly, search result RES_K1(1) has propagated to output register REG2 420-2, search result RES_K1 (2) has propagated to output register 420-4, search result RES_K1 (3) is stored and output by register 420-5, and search result RES_K1(4) is output on output bus OBUS4 408-4. As illustrated by FIG. 5A, such output values can be prioritized or otherwise manipulated to generate a final result RES_K1.

Figure 5B:
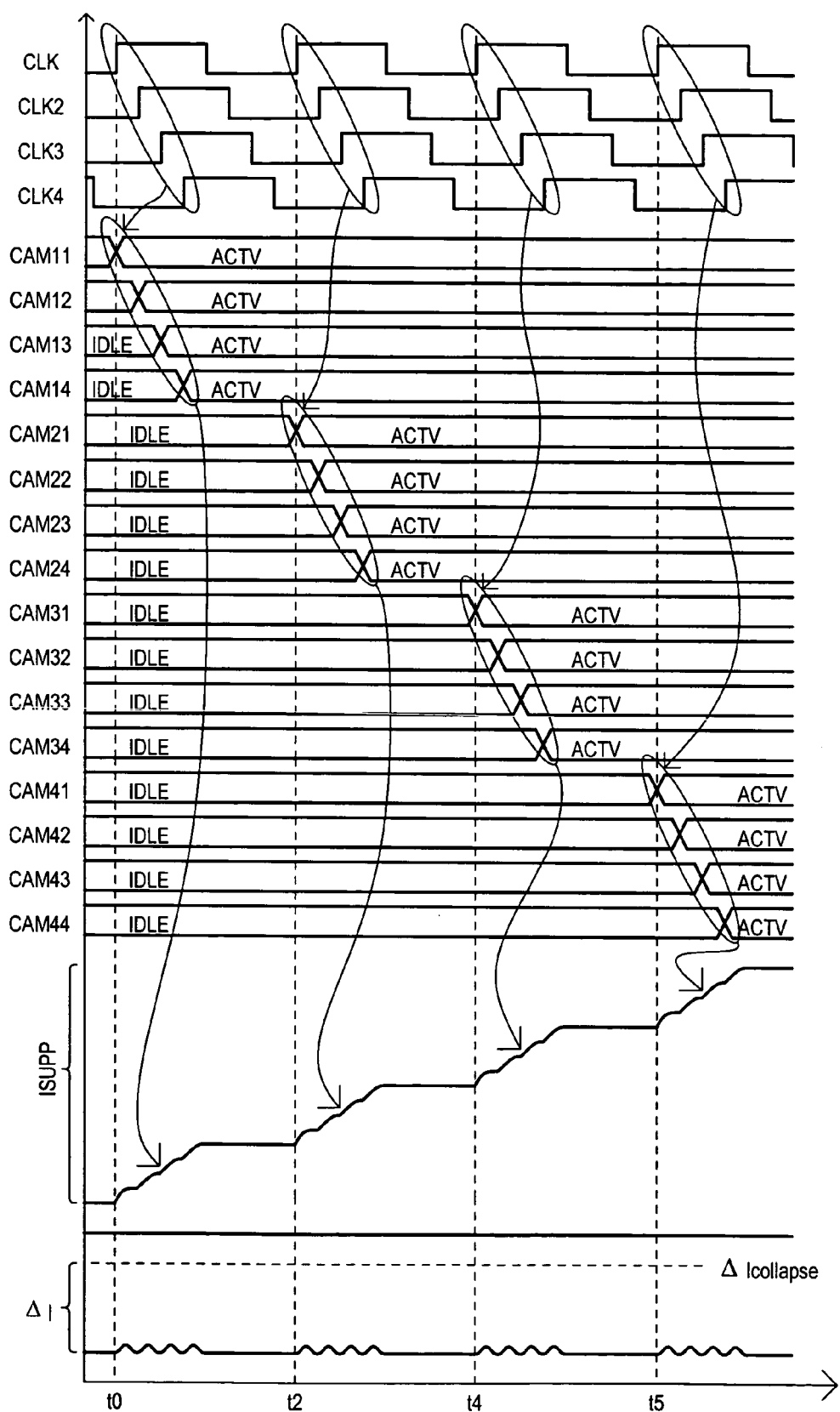
Figure 6:
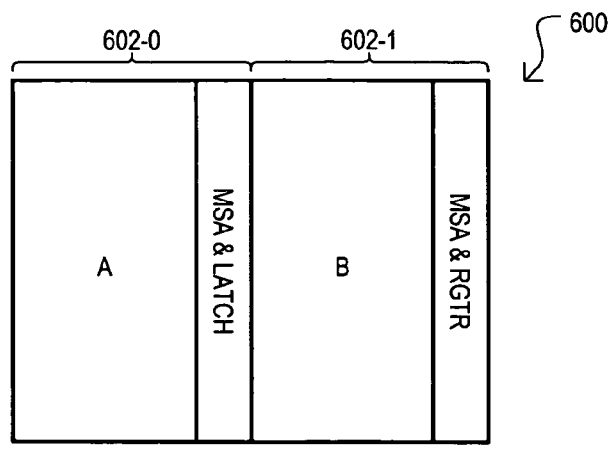
FIG. 6 is a block diagram of a CAM device having halves that operate on alternate edges of a clock signal.

Current consuming advantages of the embodiment set forth in FIG. 4 are shown in a timing diagram in FIG. 5B. FIG. 5B shows the same operation shown in FIG. 5A. FIG. 5B is a timing diagram having a number of waveforms including the clock CLK, and activation clocks CLK2 to CLK4, the state of the CAM cores (active or idle), a power supply current level ISUPP, and current surge (ΔI) value. It is understood that waveforms CAM11 to CAM44 show the state of CAM cores 402-11 to 402-44, respectively.

As shown in the figure, a rising edge of clock signal CLK results in the sequential activation of activation clocks CLK2 and CLK4 by operation of second control circuit 412. The sequential activation of such clocks (CLK and CLK2 to CLK4) results in the corresponding sequential activation of CAM cores CAM11, 12, 13 and 14 as a first key value K1 is searched.

As shown by waveform ISUPP, the sequential activation of CAM cores within each section (404-1 to 404-4) results in a more gradual increase in supply current.

Each following cycle introduces the same gradual increase in supply current, as the CAM cores in each section are sequentially activated.

Figure 7A:
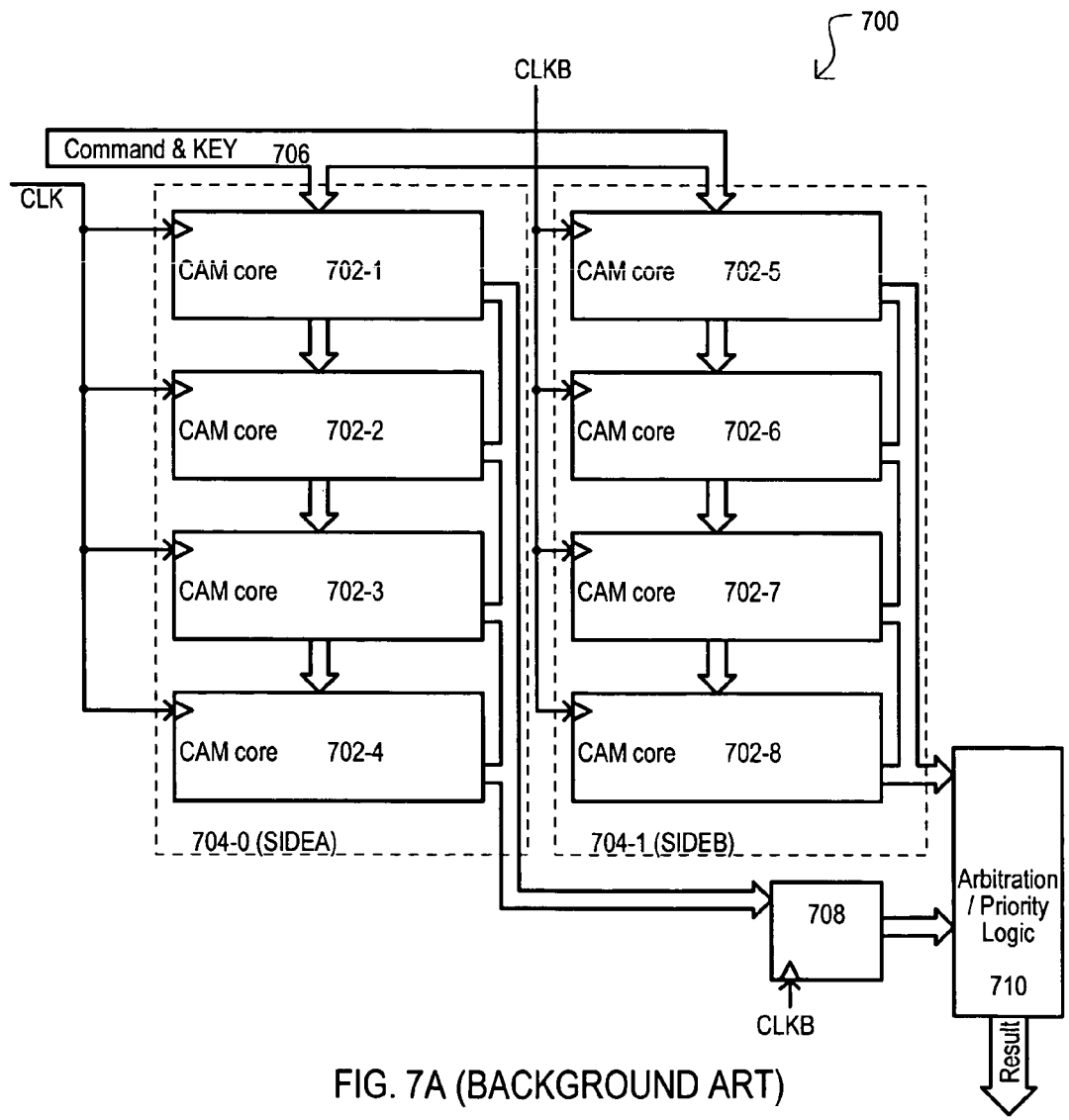
FIG. 7A is block schematic diagram of a CAM device having halves that operate on alternate edges of a clock signal.
Figure 7B:
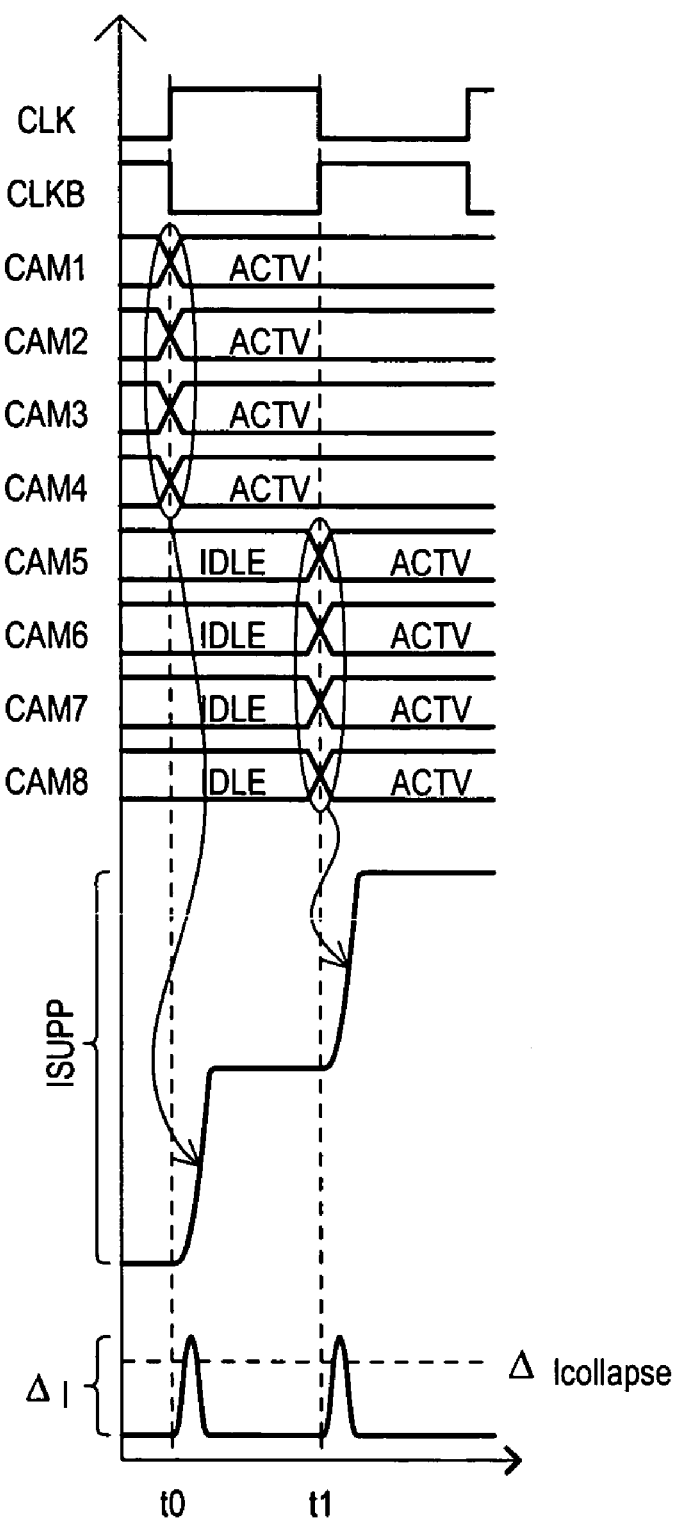
FIG. 7B is a timing diagram showing the operation of the CAM device of FIG. 7A.
Figure 8A:
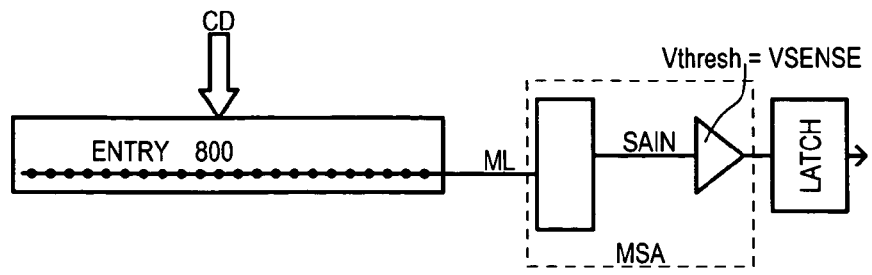
FIG. 8A is a block schematic diagram of a CAM entry and associated sense circuitry.
Figure 8B:
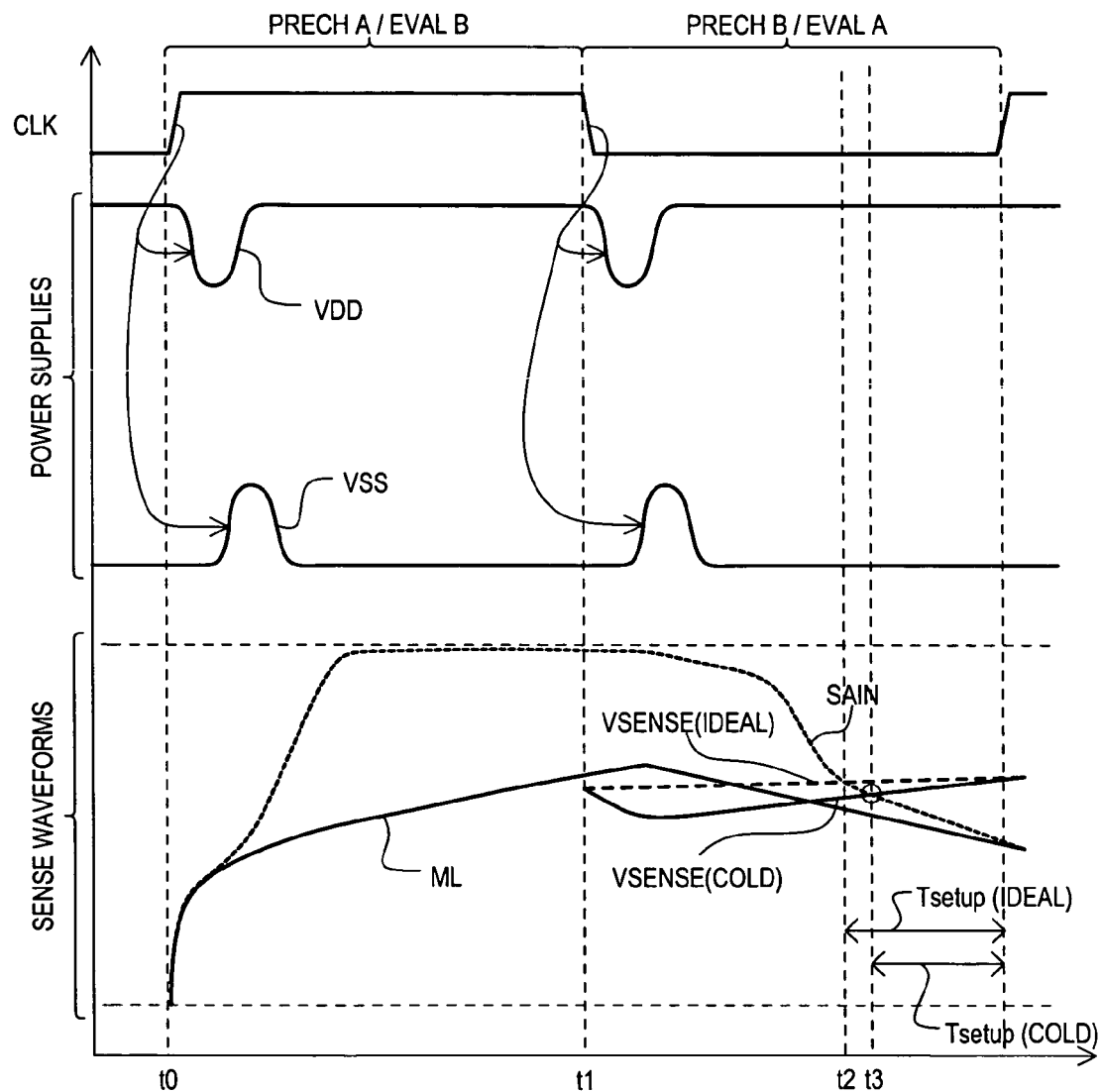
FIG. 8B is a timing diagram showing one example of a cold start error.

The advantages of the embodiment of FIG. 4 may be best understood by comparing the ΔI waveform of FIG. 5B with that of FIG. 7B. As shown, according to the embodiment of the present invention, current surges can remain well below the undesirable limit of ΔIcollapse.

In this way, current surges in a CAM device can be limited by a unique, sequential activation of CAM cores.

While the above example has shown four cycles for each search, one skilled in the art could readily incorporate the present invention into any number of pipeline cycles.

Further, while the above examples have described a search operation that activates portions of a CAM device, this should not be construed as limiting the invention thereto. Other operations can result in such sequential activation. As but one example, a "learn" command may result in the same general activation sequence.

An overall effect of the disclosed embodiments can be to greatly reduce the ramp rate of the current demand for a CAM device as it switches from an idle state to an active state. This can allow capacitors mounted on a printed circuit board (PCB) containing one or more CAM devices to have time to respond through the inductance of the packaging and mounting. While the disclosed arrangements may introduce a few extra cycles of latency, throughput is not affected.

As stated above, a reduction in the rise and fall rate of a supply current for a CAM device can reduce a power supply (VDD) sag and/or rise that can be caused by package inductance. Such an affect can reduce or eliminate the "cold start" problems, detailed above.

Such cold start problems are anticipated to get worse as next generation devices increase in capacity, drawing more current, and require faster switching speeds. At the same time, packaging inductance and on-chip capacitance will not change dramatically.

For this reason, the various embodiments of the present invention can enjoy wide application in various industries. As but one example, CAM devices and power saving methods of the present invention can be utilized in packet processing devices, such as routers and switches, as look up tables for packet forwarding, classification, and the like. In such an application power supply transients can be reduced without loss of compare data throughput.

It is also understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A content addressable memory (CAM) device, comprising:
   a plurality of sections, each section including a plurality of blocks, each block including a plurality of CAM entries and having an active mode and an idle mode, the active mode consuming more current than the idle mode;
   a first control circuit that sequentially applies command data to the sections; and
   a second control circuit that activates the blocks in each section in a sequential fashion.

2. The CAM device of claim 1, wherein:
   the each block enters the active mode in response to at least a search command.

3. The CAM device of claim 1, wherein:
   the first control circuit applies command and search data to the sections according to a periodic signal.

4. The CAM device of claim 3, wherein:
   the periodic signal has a period T; and
   the second control circuit sequentially activates all blocks in a given section within the period T.

5. The CAM device of claim 3, wherein:
   the second control circuit sequentially activates all blocks in a given section within the period ½ T.

6. The CAM device of claim 1, wherein:
   the plurality of sections includes a first section and at least one subsequent section; and
   the first control circuit comprises a command and data register coupled to an input of each subsequent section, the command and data registers being commonly controlled by timing signal.

7. The CAM device of claim 1, wherein:
   the plurality of blocks within each section include a first block and at least one subsequent block; and
   the second control circuit comprises a delay circuit having an output coupled to each subsequent block arranged in series, with a first delay circuit in the series receiving a timing signal.

8. The CAM device of claim 7, wherein:
   the first control circuit sequentially applies command and search data to the sections according to a periodic clock signal; and
   the second control circuit receives the periodic signal as the timing signal.

9. The CAM device of claim 8, wherein:
   the periodic clock signal has a period T; and
   each delay circuit delays the periodic clock signal by no more than ⅛ T.

10. The CAM device of claim 1, further including:
    each section provides section results on a corresponding output bus;
    a result logic circuit that generates an overall device result from the section results; and
    an output synchronizing circuit coupled to each output bus that provides section results of each section to the result logic circuit.

11. The CAM device of claim 10, wherein:
    the plurality of sections have an order corresponding to the order in which command and search data is received; and
    the output synchronizing circuit comprises a clocked output path corresponding to at least a first section and a subsequent section, the clocked output path corresponding to the first section having a plurality of result registers arranged in series between the output bus of the first section and the result logic circuit, the clocked output paths for subsequent sections having a smaller number of result registers according to the order of the sections.

12. A content addressable memory (CAM) device, comprising:
   a plurality of blocks logically arranged into matrix of rows and columns, each block including a plurality of CAM entries that each search operation compares a stored data value with an applied search key;
   a first control circuit that sequentially activates columns of blocks in response to the same search command; and
   a second control circuit that sequentially activates rows of blocks in response to the same search command.

13. The CAM device of claim 12, wherein:
   the matrix of blocks includes a first column having a column input coupled to a first input bus and a plurality of subsequent columns;
   the first control circuit comprises a plurality of command data registers coupled in series with one another, including a first command data register having an input coupled to the first input bus, each command data register having an output coupled to one of the subsequent columns; and
   the second control circuit comprises a plurality of delay circuits coupled in series with one another, including a first delay circuit having an input coupled to a clock signal, and a plurality of subsequent delay circuits, each delay circuit having an output coupled to one of the rows.

14. A method of activating a content addressable memory (CAM) device in response to a command, comprising the steps of:
   receiving a predetermined CAM operation command;
   sequentially applying command data to multiple sections of the CAM device; and
   sequentially activating multiple blocks within each section.

15. The method of claim 14, wherein:
   the predetermined CAM operation command comprises a search command and search key data.

16. The method of claim 14, wherein:
   the step of sequentially applying command data to multiple sections includes
      applying command data to first section, and
      applying command data to a subsequent section after all of the multiple blocks of a previous section have been sequentially activated to process the same command data.

17. The method of claim 14, wherein:
   the step of sequentially applying command data to multiple sections of the CAM device includes applying command data on subsequent edges of a periodic clock signal.

18. The method of claim 14, wherein:
   the step of sequentially activating multiple blocks within each section includes
      generating a plurality of block activation signals by delaying the periodic clock signal by increasingly larger amounts, and
      activating each block according to a different block activation signal.

19. The method of claim 14, wherein:
   the number of blocks in each section is N;
   the periodic signal as a period T; and
   the block activation signals are delayed by an amount no more than T/N.

20. The method of claim 14, wherein:
   the number of blocks in each section is N;
   the periodic signal as a period T; and
   the block activation signals are delayed by an amount no more than T/(2N).

* * * * *